(12) United States Patent
Perrin et al.

(10) Patent No.: US 6,623,993 B2
(45) Date of Patent: Sep. 23, 2003

(54) METHOD OF DETERMINING THE TIME FOR POLISHING THE SURFACE OF AN INTEGRATED CIRCUIT WAFER

(75) Inventors: Emmanuel Perrin, Biviers (FR); Herve Jaouen, Meylan (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 09/898,523

(22) Filed: Jul. 3, 2001

(65) Prior Publication Data

US 2002/0031848 A1 Mar. 14, 2002

(30) Foreign Application Priority Data

Jul. 3, 2000 (FR) .............................. 00 08576

(51) Int. Cl.⁷ .......................... G01R 31/26; H01L 21/66
(52) U.S. Cl. ............... 438/14; 438/11; 438/18; 438/690; 438/691; 438/692
(58) Field of Search ............... 438/14, 8, 9, 16, 438/690, 691, 692, 5, 11, 18

(56) References Cited

U.S. PATENT DOCUMENTS

| | | |
|---|---|---|
| 5,665,199 A | 9/1997 | Sahota et al. |
| 5,667,424 A | 9/1997 | Pan |
| 5,695,601 A * | 12/1997 | Kodera et al. ............... 438/16 |
| 5,978,750 A * | 11/1999 | Adams ...................... 702/168 |
| 6,010,538 A | 1/2000 | Sun et al. |

OTHER PUBLICATIONS

French Preliminary Search Report dated May 14, 2001 for French Application No. 0008576.

* cited by examiner

*Primary Examiner*—Olik Chaudhuri
*Assistant Examiner*—Khiem Nguyen
(74) *Attorney, Agent, or Firm*—Lisa K. Jorgenson; Stephen Bongini; Fleit, Kain, Gibbons, Gutman & Bongini P.L.

(57) ABSTRACT

A method of determining the time for polishing the surface of an integrated circuit wafer on a polishing machine. A sample wafer is fabricated to include at least one high plateau and at least one low plateau joined by a sudden transition. At least one initial profile is topographically scanned, and the surface of the sample wafer is polished at a particular polishing pressure for a particular polishing time. The final profile of the polished layer is topographically scanned in the corresponding area, and the initial and final topographical scans of the sample wafer are converted into Fourier series. The surface of the wafer to be polished is topographically scanned, and the topographic scan of the wafer to be polished is converted into a Fourier series. The time for polishing the wafer to be polished is calculated from the Fourier series and the average thickness to be removed.

13 Claims, 3 Drawing Sheets

METHOD OF DETERMINING THE TIME FOR POLISHING THE SURFACE OF AN INTEGRATED CIRCUIT WAFER

CROSS-REFERENCE TO RELATED APPLICATIONS

This application is based upon and claims priority from prior French Patent Application No. 00-08576, filed Jul. 3, 2000, the entire disclosure of which is herein incorporated by reference.

BACKGROUND OF THE INVENTION

1. Field of the Invention

The present invention relates to semiconductor device fabrication, and more specifically to the polishing of the surface of an integrated circuit wafer.

2. Description of Related Art

The present invention is directed to a method of determining the time for polishing the surface of an integrated circuit wafer, which includes a layer of a material to be polished, on a mechanical/chemical polishing machine. Conventionally, the polishing time for the surface of a wafer is determined through trial and error on successive wafers. This trial and error process causes the successive wafers that are used to make the polishing time determination to then be unusable, so they must consequently be rejected.

SUMMARY OF THE INVENTION

In view of these drawbacks, it is an object of the present invention to overcome the above-mentioned drawbacks and to provide a method for determining the time for polishing an integrated circuit wafer so as to remove from a layer to be polished a predetermined average thickness so as to confer on it a particular final topography.

One embodiment of the present invention provides a method of determining the time for polishing the surface of an integrated circuit wafer to be polished on a polishing machine so as to remove from a layer of a material to be polished a predetermined average thickness and confer a particular final topography. According to the method, a sample wafer is fabricated by depositing a layer of the material to be polished such that the layer forms at least one high plateau and at least one low plateau that are joined by a sudden transition. At least one initial profile of the layer that includes the transition on the surface of the sample wafer is topographically scanned, and the surface of the sample wafer is polished on the polishing machine at a particular polishing pressure for a particular polishing time. The final profile of the polished layer is topographically scanned in an area corresponding to the initial profile, and the initial topographical scan and the final topographical scan of the sample wafer are converted into Fourier series. The surface of the wafer to be polished is topographically scanned, and the topographical scan of the wafer to be polished is converted into a Fourier series. The time for polishing the wafer to be polished is calculated from the Fourier series and the average thickness to be removed. In a preferred embodiment, the wafer to be polished is polished for the calculated polishing time.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Preferred embodiments of the present invention provide methods for determining the time for polishing an integrated circuit wafer (such as one of a series of identical wafers to be polished in the same way) so as to remove from a layer to be polished (such as a layer of dielectric material) a predetermined average thickness so as to confer on it a particular final topography. In preferred embodiments of the present invention, the wafer or wafers to be polished are regarded as having particular constructional and adjustment characteristics, in particular on a polishing machine in which the wafer to be polished is gripped at a particular pressure (Po) between a rotary head and a polishing cloth carried by a turntable and covered with an abrasive material.

In one preferred embodiment, a sample wafer is fabricated by depositing a layer of the material to be polished so that the layer forms at least one high plateau and one low plateau that are joined by a sudden transition, and at least one initial profile of the layer that includes the transition is topographically scanned. Then, the surface of the sample wafer is polished on the polishing machine at a particular polishing pressure (Po) and for a particular polishing time (t). Next, the final profile of the layer polished in this way is topographically scanned in the area corresponding to the initial profile. The initial topographical scan and the final topographical scan of the sample wafer are converted into Fourier series.

Additionally, the surface of the wafer to be polished is topographically scanned and the topographic scan of the wafer to be polished is converted into a Fourier series. Then, the time (T) for polishing the wafer to be polished is calculated from the Fourier series and the average thickness ($e_m$) to be removed. Once that time is known, the wafer or series of wafers to be polished are each polished for the polishing time (T) so that the final topography of the surface of the polished wafer corresponds to the required topography.

Figure 1:
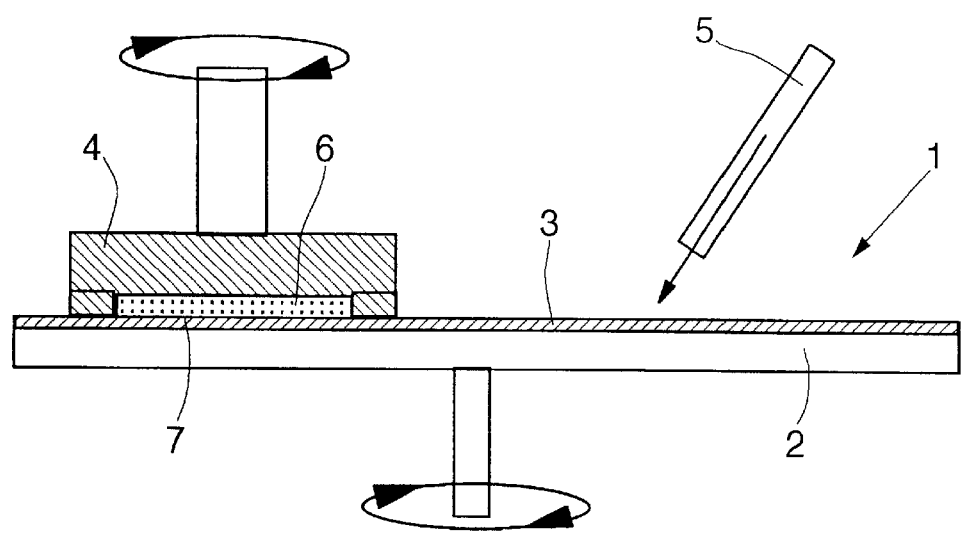
FIG. 1 is a diagram of an exemplary polishing machine.

One embodiment of the present invention will now be explained in detail with reference to FIGS. 1–5. FIG. 1 shows an exemplary mechanical/chemical polishing machine. As shown, the mechanical/chemical polishing machine 1 conventionally includes a turntable 2 covered with a polishing cloth 3, a rotary polishing head 4, and a nozzle 5 for feeding an abrasive material onto the polishing cloth 3. A wafer 6 to be polished is gripped between the rotary head 4 and the turntable 2 so that its face 7 to be polished is in contact with the polishing cloth 3.

The polishing machine 1 therefore has particular structural, functional, and adjustment characteristics, including in particular the rotation speeds of the head 4 and the turntable 2, the particular mechanical properties of the polishing cloth 3, the material constituting the abrasive fed via the nozzle 5, and a particular polishing pressure Po. Accordingly, the thickness or average thickness removed from the wafer 6, and therefore the final topography of the surface of the wafer 6 after polishing, depend on the time during which the wafer is polished on the machine 1.

Figure 4:
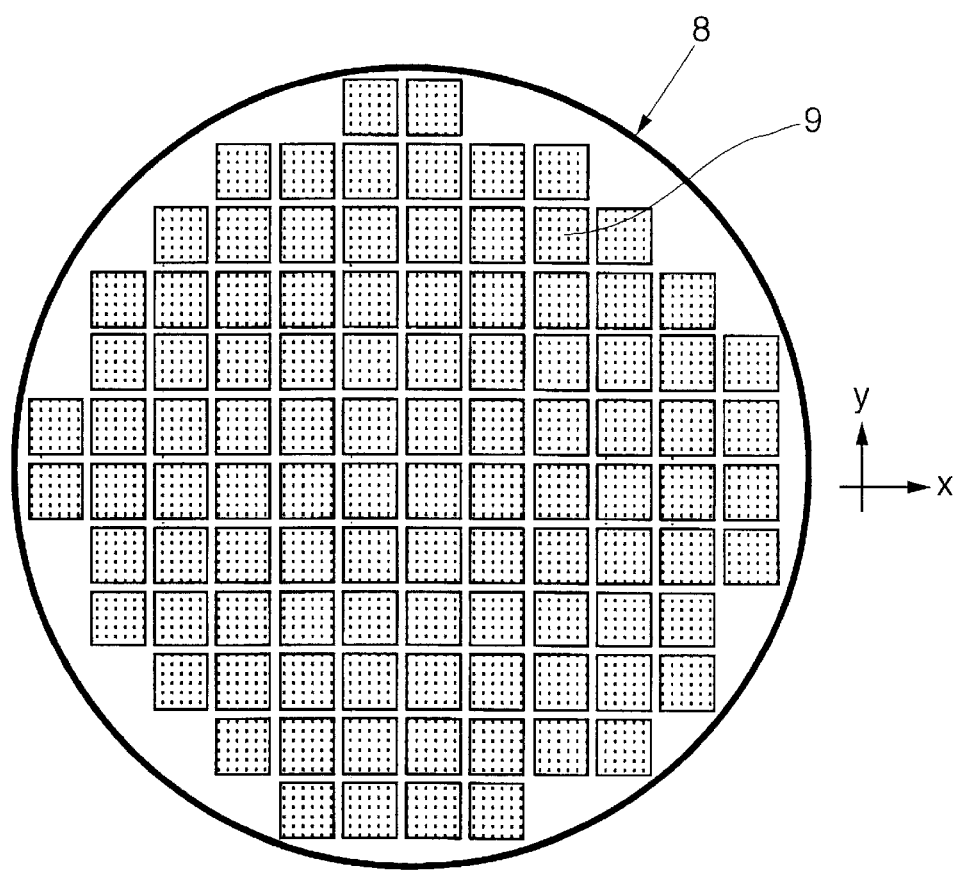
FIG. 4 is a plan view of a wafer to be polished.
Figure 5:
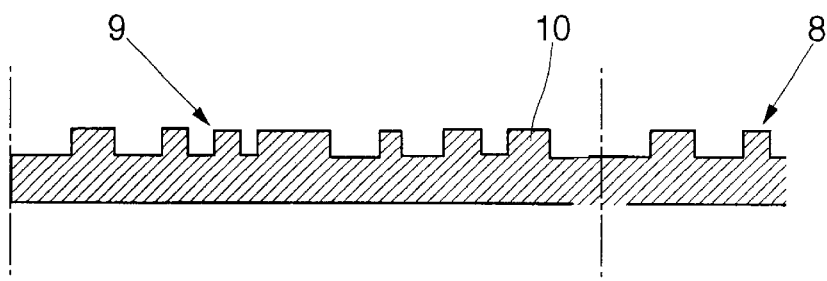
FIG. 5 shows a part of the wafer of FIG. 4 in cross-section.

The method used to determine the time for polishing an integrated circuit wafer 8 shown in FIGS. 4 and 5 will now be described. The wafer 8 includes a multiplicity of identical areas 9 corresponding to integrated circuits to be fabricated. The surface of the wafer 8 has projecting and recessed parts and includes a dielectric material layer 10 which espouses the shapes of identical underlying patterns, for example metal patterns, in each area 9.

First Step

Figure 2:
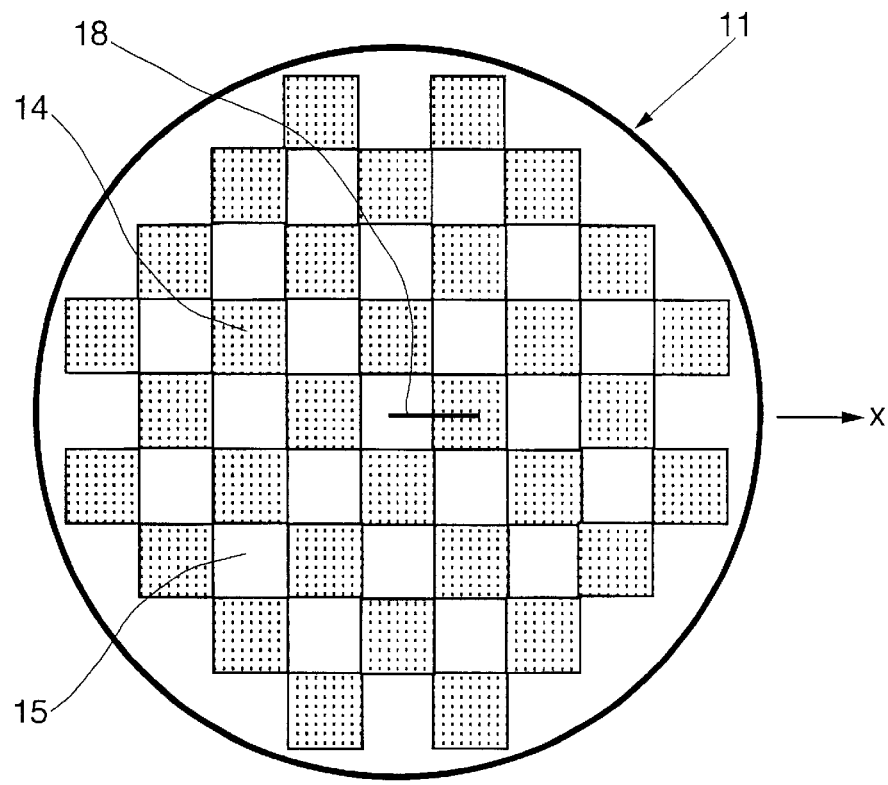
FIG. 2 is a plan view of a sample wafer.
Figure 3:
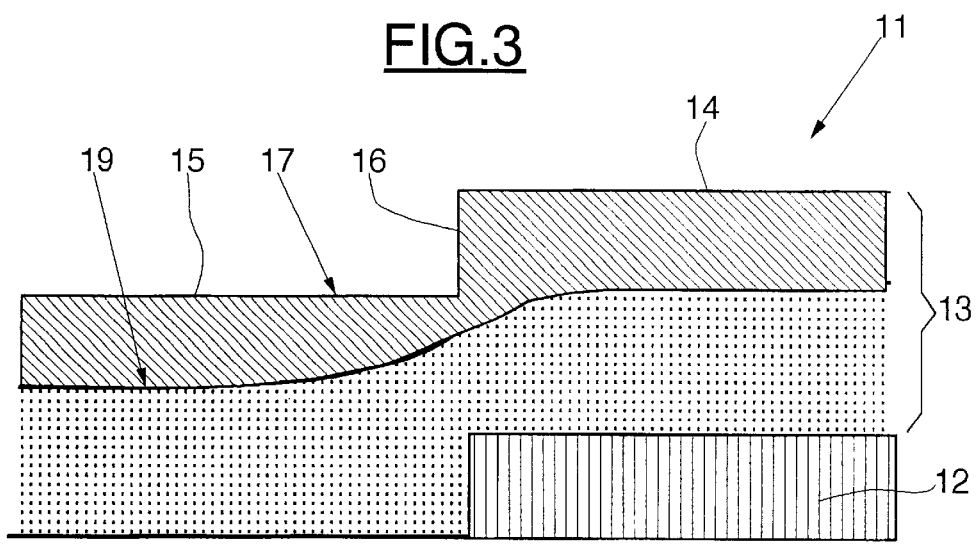
FIG. 3 shows a part of the sample wafer of FIG. 2 in cross-section.

A sample wafer 11 shown in FIGS. 2 and 3 is first fabricated and includes a multiplicity of regularly distributed parallelepiped-shaped patterns 12 (for example, made of a metal). The surface of the sample wafer 11 is covered with a layer 13 of a material identical to that of the layer 10 of the wafer 8 to be polished (for example, a dielectric material). The layer 13 therefore includes high plateaux 14 and low plateaux 15, which are joined by abrupt transitions 16. The high plateaux 14 are above the patterns 12, and the surface of the sample wafer resembles a chessboard. In one exemplary embodiment, the squares constituting the chessboard have a side length of 18 millimeters and the difference in altitude between the high plateaux and the low plateaux is equal to one micron.

An initial profile 17 of the layer including a transition 16 on the surface of the sample wafer 11 is then scanned topographically (for example, by optical measurements, using conventional reflectometry and profilometry apparatus) at different points of an abscissa line 18 which is perpendicular to a transition 16 and on respective opposite sides of that transition on the low plateau 14 and on the high plateau 15, to constitute an initial matrix Me(initial) associating the abscissae x with the corresponding altitudes v(x,0). In one exemplary embodiment, 200 points distributed over a distance of 9 millimeters to either side of the transition 16 are scanned.

Second Step

The sample wafer 11 is then placed on the machine 1 and its surface is polished at a particular polishing pressure Po for a polishing time t. A final profile 19 on the surface of the sample wafer 11 is then scanned topographically (for example, by optical measurements using conventional reflectometry and profilometry apparatus) at different points of the aforementioned abscissa line 17, to constitute a final matrix Me(final) associating the abscissae x with the corresponding altitudes v(x,t).

Third Step

The initial matrix Me(initial) and the final matrix Me(final) are stored in a programmed computer along with operating conditions of the polishing machine 1, such as the polishing pressure Po, the attack speed Va, and the time t for which the sample wafer is polished. The scanned matrices are then converted into Fourier series by applying the following two equations.

$$v(x,0) = \sum_i A_i(0) \cdot \cos\left(\frac{2\pi \cdot x}{\lambda_i}\right) \quad (I)$$

and $$v(x,t) = \sum_i A_i(t) \cdot \cos\left(\frac{2\pi \cdot x}{\lambda_i}\right) \quad (II)$$

In the above equations, $\lambda_i$ represents the wavelengths of the Fourier series and Ai represents the amplitudes of the components of the Fourier series describing the aforementioned profiles.

Having prefixed at least two particular wavelengths $\lambda_1$ and $\lambda_2$, the computer then calculates for those particular wavelengths the amplitudes A1($o$) and A2($o$) of the components of the Fourier series corresponding to the initial profile 17 of the sample wafer 11 and the amplitudes A1($t$) and A2($t$) of the components of the Fourier series corresponding to the final profile 18 of the sample wafer 11. In one exemplary embodiment, those wavelengths are equal to 1 millimeter and 10 millimeters.

Fourth Step

The fourth step calculates the values of two functional coefficients k and D. These coefficients are advantageously representative of local deformations of the polishing cloth 3 installed on the polishing machine 1 caused by the polishing operation.

The computer is programmed to use the following system of two equations in two unknowns k and D.

$$\frac{A_1(t)}{A_1(0)} = \exp\left[-\left(k + D \cdot \left(\frac{2\pi}{\lambda_1}\right)^4\right) \cdot a\right] \quad (IIIa)$$

and $$\frac{A_2(t)}{A_2(0)} = \exp\left[-\left(k + D \cdot \left(\frac{2\pi}{\lambda_2}\right)^4\right) \cdot a\right] \quad (IIIb)$$

In the above equations, "a" is equal to the average thickness $e_m$ removed from the sample wafer 11 divided by the polishing pressure Po, with the average thickness $e_m$ removed being equal to the speed of attack Va multiplied by the time t for which the sample wafer 11 is polished.

The computer solves the above system of equations and supplies the values of the coefficients k and D. In one exemplary embodiment, the thickness $e_m$ is equal to 0.7 microns and the pressure Po is equal to $3 \times 10^4$ Pa. Under the above conditions, the coefficient k calculated is equal to $10^6$ Pa.mm$^{-1}$ and the coefficient D calculated is equal to $3.9 \times 10^7$ Pa.mm$^3$.

Fifth Step

Having calculated the functional coefficients k and D associated with the polishing machine 1, the next step is to calculate the time (T) for polishing the wafer or a series of identical wafers 8 to be polished on the polishing machine 1. For this purpose, the surface of the wafer 8 to be polished is scanned topographically in two orthogonal directions x and y to constitute an initial 3D matrix Mp(initial 3D). The computer then converts that matrix representing the initial surface of the wafer 8 to be polished into a Fourier series by applying the following equation.

$$v(x, y, 0) = \sum_i \sum_j A_i(0) A_j(0) \cdot \cos\left(\frac{2\pi \cdot x}{\lambda_i}\right) \cdot \cos\left(\frac{2\pi \cdot y}{\lambda_j}\right) \quad \text{(IV)}$$

In the above equation, x and y are the two directions in which the wafer 8 to be polished is scanned. Ai(o) and Aj(o) are the amplitudes of the components associated with the wavelengths $\lambda_i$ and $\lambda_j$ in the directions x and y on the wafer 8 to be polished.

The computer solves the above equation and delivers the values of the components Ai(o) and Aj(o). The computer is programmed to insert the above values in the following equations, to complete the simulated final topography of the surface of the wafer 8 after polishing.

$$v(x, y, T) = \sum_{i,j} A_i(0) A_j(0) \exp\left[-\left(k + D(2\pi)^4 \cdot \left(\frac{1}{\lambda_i^2} + \frac{1}{\lambda_j^2}\right)^2\right) \cdot \frac{Va \cdot T}{P_0}\right] \cos\left(\frac{2\pi x}{\lambda_i}\right) \cos\left(\frac{2\pi y}{\lambda_j}\right) \quad \text{(V)}$$

The parameters in the above equation are defined or indicated above. The computer then calculates the time T to polish the wafer 8 to be polished such that the required final topography of the wafer 8 is obtained after that polishing time on the polishing machine 1. The time T being calculated, all that remains is to program the control system of the polishing machine 1 so that each wafer 8 to be polished, installed between the polishing cloth 3 and the polishing head 4, is polished for a time period equal to the calculated value T. The other operating conditions of the machine 1 used to carry out the aforementioned polishing operation on the sample wafer 11 remain unchanged.

While there has been illustrated and described what are presently considered to be the preferred embodiments of the present invention, it will be understood by those skilled in the art that various other modifications maybe made, and equivalents maybe substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of determining the time for polishing the surface of an integrated circuit wafer to be polished on a polishing machine so as to remove from a layer of a material to be polished a predetermined average thickness and confer a particular final topography, the wafer to be polished being gripped by the polishing machine at a particular pressure between a rotary head and a polishing cloth carried by a turntable and covered with an abrasive material, said method comprising the steps of:

fabricating a sample wafer by depositing a layer of the material to be polished such that the layer forms at least one high plateau and at least one low plateau that are joined by a sudden transition;

topographically scanning at least one initial profile of the layer that includes the transition on the surface of the sample wafer;

polishing the surface of the sample wafer on the polishing machine at a particular polishing pressure for a particular polishing time;

topographically scanning the final profile of the polished layer in an area corresponding to the initial profile;

converting the initial topographical scan and the final topographical scan of the sample wafer into Fourier series;

topographically scanning the surface of the wafer to be polished;

converting the topographical scan of the wafer to be polished into a Fourier series; and calculating the time for polishing the wafer to be polished from the Fourier series and the average thickness to be removed, wherein the sample wafer is not identical to the wafer to be polished.

2. A method of determining the time for polishing the surface of an integrated circuit wafer to be polished on a polishing machine so as to remove from a layer of a material to be polished a predetermined average thickness and confer a particular final topography, the wafer to be polished being gripped by the polishing machine at a particular pressure between a rotary head and a polishing cloth carried by a turntable and covered with an abrasive material, said method comprising the steps of:

fabricating a sample wafer by depositing a layer of the material to be polished such that the layer forms at least one high plateau and at least one low plateau that are joined by a sudden transition;

topographically scanning at least one initial profile of the layer that includes the transition on the surface of the sample wafer;

polishing the surface of the sample wafer on the polishing machine at a particular polishing pressure for a particular polishing time;

topographically scanning the final profile of the polished layer in an area corresponding to the initial profile;

converting the initial topographical scan and the final topographical scan of the sample wafer into Fourier series;

topographically scanning the surface of the wafer to be polished;

converting the topographical scan of the wafer to be polished into a Fourier series; and calculating the time for polishing the wafer to be polished from the Fourier series and the average thickness to be removed, wherein in the step of converting the initial topographical scan and the final topographical scan, the initial topographical scan and the final topographical scan of the sample wafer are converted into Fourier series by applying the following equations:

$$v(x, 0) = \sum_i A_i(0) \cdot \cos\left(\frac{2\pi \cdot x}{\lambda_i}\right) \quad \text{(I)}$$

and

-continued $$v(x, t) = \sum_i A_i(t) \cdot \cos\left(\frac{2\pi \cdot x}{\lambda_i}\right) \quad \text{(II)}$$

with x and v representing the abscissa and the altitude of points of the scanned profiles, $\lambda_i$ representing wavelengths of the Fourier series describing the aforementioned profiles, and Ai representing the amplitudes of the components of the Fourier series describing the aforementioned profiles.

3. The method according to claim 2, further comprising the step of calculating for at least two particular wavelengths ($\lambda 1, \lambda 2$) the amplitudes A1(o) and A2(o) of the components of the Fourier series corresponding to the initial profile of the sample wafer and the amplitudes A1(t) and A2(t) of the components of the Fourier series corresponding to the final profile of the sample wafer.

4. The method according to claim 3, further comprising the step of calculating adjustment coefficients k and D by solving the following system of equations:

$$\frac{A_1(t)}{A_1(0)} = \exp\left[-\left(k + D \cdot \left(\frac{2\pi}{\lambda_1}\right)^4\right) \cdot a\right] \quad \text{(IIIa)}$$

and $$\frac{A_2(t)}{A_2(0)} = \exp\left[-\left(k + D \cdot \left(\frac{2\pi}{\lambda_2}\right)^4\right) \cdot a\right]. \quad \text{(IIIb)}$$

5. The method according to claim 4, further comprising the step of decomposing the initial surface of the wafer to be polished into Fourier series by applying the following equation:

$$v(x, y, 0) = \sum_i \sum_j A_i(0) A_j(0) \cdot \cos\left(\frac{2\pi \cdot x}{\lambda_i}\right) \cdot \cos\left(\frac{2\pi \cdot y}{\lambda_j}\right) \quad \text{(IV)}$$

with x and y representing two directions in which the scans are effected, and Ai(o) and Aj(o) being the amplitudes of the components associated with the wavelengths $\lambda_i$ and $\lambda_j$ in the directions x and y.

6. The method according to claim 5, wherein in the step of calculating the time for polishing, the time (T) for polishing the wafer to be polished is calculated from the following equation:

$$v(x, y, T) = \sum_{i,j} A_i(0) A_j(0) \exp\left[-\left(k + D(2\pi)^4 \cdot \left(\frac{1}{\lambda_i^2} + \frac{1}{\lambda_j^2}\right)^2\right) \cdot \frac{V_a \cdot T}{P_0}\right] \cos\left(\frac{2\pi x}{\lambda_i}\right) \cos\left(\frac{2\pi y}{\lambda_j}\right). \quad \text{(V)}$$

7. The method according to claim 6, further comprising the step of polishing the wafer to be polished for the calculated polishing time.

8. The method according to claim 1, further comprising the step of polishing the wafer to be polished for the calculated polishing time.

9. The method according to claim 1, wherein the topography of the surface of the wafer to be polished is substantially different than the initial topography of the surface of the sample wafer.

10. A method of determining the time for polishing the surface of an integrated circuit wafer to be polished on a polishing machine so as to remove from a layer of a material to be polished a predetermined average thickness and confer a particular final topography, the wafer to be polished being gripped by the polishing machine at a particular pressure between a rotary head and a polishing cloth carried by a turntable and covered with an abrasive material, said method comprising the steps of:

fabricating a sample wafer by depositing a layer of the material to be polished such that the surface of the sample wafer has at least one high plateau and at least one low plateau that are joined by a sudden transition;

topographically scanning the surface of the sample wafer so as to determine at least one initial topographical profile of the surface of the sample wafer that includes the sudden transition;

polishing the surface of the sample wafer on the polishing machine at a particular polishing pressure for a predetermined polishing time;

topographically scanning the surface of the sample wafer after polishing so as to determine a final topographical profile of the surface of the sample wafer in an area corresponding to the initial topographical profile;

converting the initial topographical profile and the final topographical profile of the sample wafer into Fourier series;

topographically scanning the surface of the wafer to be polished so as to determine at least one initial topographical profile of the surface of the wafer to be polished;

converting the topographical profile of the wafer to be polished into a Fourier series; and calculating the time for polishing the wafer to be polished from the Fourier series and the average thickness to be removed.

11. The method according to claim 10, wherein the initial topography of the surface of the wafer to be polished is substantially different than the initial topography of the surface of the sample wafer.

12. The method according to claim 10, wherein the sample wafer is not identical to the wafer to be polished.

13. The method according to claim 10, wherein in the step of converting the initial topographical profile and the final topographical profile, the initial topographical profile and the final topographical profile of the sample wafer are converted into Fourier series by applying the following equations:

$$v(x, 0) = \sum_i A_i(0) \cdot \cos\left(\frac{2\pi \cdot x}{\lambda_i}\right) \quad \text{(I)}$$

and $$v(x, t) = \sum_i A_i(t) \cdot \cos\left(\frac{2\pi \cdot x}{\lambda_i}\right) \quad \text{(II)}$$

with x and v representing the abscissa and the altitude of points of the scanned profiles, $\lambda_i$ representing wavelengths of the Fourier series describing the aforementioned profiles, and Ai representing the amplitudes of the components of the Fourier series describing the aforementioned profiles.

* * * * *